US006541180B1

(12) United States Patent
Onogawa

(10) Patent No.: US 6,541,180 B1
(45) Date of Patent: Apr. 1, 2003

(54) PHOTOSENSITIVE LITHOGRAPHIC PRINTING PLATE

(75) Inventor: Toru Onogawa, Shizuoka (JP)

(73) Assignee: Fuji Photo Film Co., Ltd., Kanagawa-ken (JP)

(*) Notice: Subject to any disclaimer, the term of this patent is extended or adjusted under 35 U.S.C. 154(b) by 49 days.

(21) Appl. No.: 09/625,958

(22) Filed: Jul. 26, 2000

(30) Foreign Application Priority Data

Jul. 29, 1999 (JP) ........................................ 11-214956

(51) Int. Cl.[7] ........................... B41C 1/10; G03F 7/115

(52) U.S. Cl. .................................... 430/273.1; 430/950

(58) Field of Search .............................. 430/950, 273.1

(56) References Cited

U.S. PATENT DOCUMENTS

| | | | | |
|---|---|---|---|---|
| 4,288,521 A | * 9/1981 | Kojima et al. | ........... | 430/273.1 |
| 4,626,484 A | * 12/1986 | Nishioka et al. | ......... | 430/273.1 |
| 5,576,137 A | * 11/1996 | Frass et al. | .............. | 430/273.1 |

FOREIGN PATENT DOCUMENTS

| | | | |
|---|---|---|---|
| EP | 0 602 636 A1 | 6/1994 | G03F/7/115 |
| EP | 848297 A2 * | 6/1998 | G03F/7/115 |
| JP | 43-28403 | 12/1943 | 116/41 |
| JP | 57-34558 | 2/1982 | G03F/7/02 |
| JP | 58-137469 | 8/1983 | B03D/7/02 |
| JP | 59-219751 | 12/1984 | G03F/7/02 |
| JP | 10-13383 | 5/1998 | G03F/7/115 |

OTHER PUBLICATIONS

Patent Abstracts of Japan 57034558 Feb. 24, 1982.

Patent Abstracts of Japan 58137469 Aug. 15, 1983.

Patent Abstracts of Japan 10133383 May 22, 1998.

To, S. D. Filip., "ABE Unit Conversion Calculator", Agricultural and Biological Engineering, Mississippi State University, Http://grapevine.abe.msstate.edu/~fto/calculator/unit.html last updated Aug. 24, 1997.*

103:14622, Fuji Photo Film CO. lit, Japan, Chemical Abstracts, ACS, English abstract of JP59–219751 printed 12–1994, one page.*

Akira et al, English Abstract of JP59–219751, Patent Abstracts of Japan , copyright 1998, date of publication of application Dec. 1984, one page.*

Fuji Photo Film CO. Ltd, Derwent Acc No: 1985–023056, English abstract of JP59–219751, published Dec. 1984, two pages, Derwent Infomation LTD.*

* cited by examiner

*Primary Examiner*—Cynthia Hamilton
(74) *Attorney, Agent, or Firm*—Sughrue Mion, PLLC

(57) ABSTRACT

A photosensitive lithographic printing including mats provided thereon wherein the number of the mats each having volume of not less than 4,500 $\mu m^3$ and less than 18,000 $\mu m^3$ exceeds 20% of the total number of the provided mats. Prominent deterioration in a vacuum-adhesion-time-shortening effect, which is the primary function of the mats, is prevented even in case where the matted surface of the photosensitive lithographic printing plate is subjected to pressure after production but before use.

5 Claims, 13 Drawing Sheets

PHOTOSENSITIVE LITHOGRAPHIC PRINTING PLATE

FIELD OF THE INVENTION

The present invention relates to a photosensitive lithographic printing plate having thereon a microscopic embossment which is termed "mat".

BACKGROUND

JP-A-58-137469/1983 (the term "JP-A" as used herein means an unexamined published Japanese patent application) deals with a process for providing mats on a recording material. It discloses the distribution (distribution number), the height and the size (diameter) of mats to be formed. JP-A-10-133383/1998 touches on a photosensitive lithographic printing plate provided with microscopic patterns. It describes the average diameter, the average height and the distribution (distribution number) of the macroscopic patterns to be formed.

SUMMARY OF THE DISCLOSURE

However, various problems have been encountered in the course of investigations toward the present invention. Namely, pressure is applied to the mat-attached face of the photosensitive lithographic printing plate provided with mats resulting from the aforementioned prior art after production but before use (e.g., during storage, packaging and delivery etc.) so that the height of the mats will be varied to cause a problem that the effect of shortening vacuum adhesion time, which is the primary function of the mats, will be prominently deteriorated.

Accordingly, an object of the present invention is to provide a photosensitive lithographic printing plate in which prominent deterioration of the vacuum-adhesion-time-shortening effect which is a properly expected function of the mats will be prevented even in case that the matted face of a photosensitive lithographic printing plate having the mats thereon is subjected to pressure after production but before use of the photosensitive lithographic printing plate.

In order to solve the above problem, it would be one idea to attach a large amount of large-diameter mats for overcoming the applied pressure by virtue of their sufficient sum of areas. However, it was difficult to put this idea into practice because the mats of the large-diameter tend to deteriorate the reproducibility of small dots of small dot images upon exposure.

Therefore, the present inventors tried to control the mean volume of the mats and form many of the mats as largely as possible within a range that deterioration of small dot image reproducibility will be avoided. Consequently, it was found that a photosensitive lithographic printing plate provided with a specific ratio of the mats each having particular range of volume to the total mats can ensure good reproducibility of small dots of the small dot images, endure the pressure affecting after production but before use, and maintain the function of the mats. Thus the present invention has been completed on the basis of the above findings.

Namely, according to one aspect of the present invention, the above object can be attained by a photosensitive lithographic printing plate having mats attached thereon wherein a number of the mats, each having volume of not less than 4,500 $\mu m^3$ and less than 18,000 $\mu m^3$, exceeds 20% relative to a total number of the attached mats. The photosensitive lithographic printing plate of the present invention will be embodied as follows.

It is preferred to control the number of the mats each having volume of not less than 18,000 $\mu m^3$ to be less than 10% relative to the number of all the attached mats. The mats can be formed through atomizing a liquid containing resin dissolved therein with a rotary atomizer. All of the number ranges disclosed in this specification must include the both end values and also all of arbitrary midway values involved therebetween.

PREFERRED EMBODIMENTS OF THE INVENTION

In the photosensitive lithographic printing plate of the present invention, the number of the mats each having volume of not less than 4,500 $\mu m^3$ but less than 18,000 $\mu m^3$ exceeds 20% relative to the total number of the mats attached thereon. Preferably, they are controlled to be not less than 30%, and more preferably, not less than 40%. The mats each having volume of not less than 18,000 $\mu m^3$ are preferably controlled to be less than 10% (more preferably, less than 8%) relative to the number of all the attached mats.

A photosensitive lithographic printing plate includes at least a substrate and a photosensitive layer, and optionally, other layers. Materials of the substrate and the photosensitive layer may be those conventionally used for the usual photosensitive lithographic printing plate. The mats may be provided on places where the vacuum-adhesion-time-shortening effect of their essential function can be taken. Usually, they are provided at least on the surface of the photosensitive layer.

The mats are preferably distributed not less than 25/mm$^2$ (more preferably, not less than 30/mm$^2$, still more preferably, not less than 40/mm$^2$). The mats may be made of a material which has been conventionally used for the usual photosensitive lithographic printing plate such as various types of resin and etc.

[The Maximum Volume Value of the Mat]

A film image can be transferred to a photosensitive lithographic printing plate by bringing the film into close contact with the printing plate during exposure. When a thick air gap exists between the film and the photosensitive lithographic printing plate during this procedure, what is called "burn blur" phenomenon will occur, and accordingly, the image cannot be transferred faithfully. In order to avoid this, it is usually practiced that the film and the photosensitive lithographic printing plate are placed in a depressurized place to evacuate the air existed between them. A mat layer is necessary to be formed on the surface of the photosensitive lithographic printing plate for evacuating this air easily.

The mat layer has a function of maintaining a suitable gap between the film and the photosensitive lithographic printing plate which is appropriate for making the air existed between them easily evacuated. However, if the mat is too high, the following phenomenon will occur, i.e., the above gap will be enlarged too wide to make it impossible to transfer the film image to the printing plate with good fidelity.

Further, a large-diameter mat makes it difficult to transfer the image onto a mat-deposited spot. This phenomenon will occur as a result of excessively forming the mats with large volumes. Accordingly, it is important to inhibit the mat from exceeding certain volume. On this account, it is preferable to make the volume of one mat less than 18,000 $\mu m^3$.

[The Minimum Volume Value of the Mat]

A photosensitive lithographic printing plate can be prepared by forming a photosensitive layer, a mat layer and optionally other layer(s) on a continuous web-formed substrate. In this process, contact with rollers made of various materials, winding up, stacking after cutting, and other operations are performed. The prepared photosensitive lithographic printing plate reaches the user's hand by way of preservation, packaging, delivery and other steps. In the periods of these steps, i.e., after production but before use, forces such as pressure and the like applied, for example, on the surface of the printing plate deform the shape of the mats formed on the surface. To cope with these forces, forming a large number of mats as large as possible is an effective way for decreasing the deformation of the mats. Accordingly, it is preferable to make the volume of one mat not less than 4,500 $\mu m^3$.

[Production of the Photosensitive Lithographic Printing Plate]

The photosensitive lithographic printing plate of the present invention can be prepared through forming mats, which include those of specific volumes as defined in the present invention which are in particular ratios as determined in the present invention, on a photosensitive lithographic printing plate or a precursor thereof. The finished or unfinished photosensitive lithographic printing plate can be prepared through forming, for example, at least a photosensitive layer on a substrate before forming mats. Materials of the substrate may be those conventionally used. The photosensitive layer may be made of materials conventionally used for that of the usual photosensitive lithographic printing plate and can be formed on a substrate by applying a conventional method.

A photosensitive lithographic printing plate is prepared by laminating photosensitive layer, mat layer and if necessary other layer(s) on a continuous web substrate running by means of rollers. After forming the mats, operations such as contact with rollers which may be made of any of various materials, winding up, and stacking (in layers) of cut sheets are performed, so that pressure is inevitably applied to the mats formed on the photosensitive lithographic printing plate. In case of preparing the photosensitive lithographic printing plate defined in the present invention, the deformation of the mats resulting from the pressure applied in the preparing process after forming the mats can be prevented.

[Formation of the Mats]

In the photosensitive lithographic printing plate of the present invention, mats can be formed on the surface thereof by attaching fine particles obtained by atomizing a liquid for the mats on a photosensitive lithographic printing plate (generally on the photosensitive layer's surface thereof) and drying the fine particles attached to the photosensitive lithographic printing plate with or without heating. Here, the term "liquid for the mats" means a liquid containing a mat material for forming mats which involves both of the following cases, i.e., the case of dissolving the mat material in a solvent and the case of not dissolving but dispersing it in a dispersant.

As the mat materials, i.e., materials for forming the mats, materials conventionally used for the mats of the usual photosensitive lithographic printing plate such as various kind of resins and the like can be employed. Such mat materials include, for example, those disclosed in JP-A-57-34558/1982 such as copolymer of acrylate and acrylic or methacrylic acid; coplymer of styrene, acrylate and acrylic or methacrylic acid; coplymer of acrylate, styrene, acrylonitrile and the like with acrylic, methacrylic, maleic, itaconic or other acid; and vinyl polymers such as polyvinyl alcohol, polyvinyl acetate, polyvinyl pyrrolidone and the like.

In case of changing the mat material into the form of the liquid for the mats, it is preferable to prepare an aqueous liquid of dissolving or dispersing an appropriately selected resin by applying the conventional method. The solvent or dispersant of the mats includes water which may further contain organic solvents.

The liquid for the mats may further includes fillers, if they don't exert a harmful influence, on the photosensitive layer or on the droplets of the liquid attached thereto, such as any other water-soluble substance, fine inorganic particle or powder, polymeric powder and the like.

An exemplary process for preparing the mats may include emulsion-polymerizing raw material monomers emulsified in water with a surfactant by using a polymerization initiator such as potassium persulfate and the like to form an aqueous dispersion in the same way as to synthesize usual latexes, or changing partially acrylic, methacrylic, maleic, itaconic and other acids into sodium, potassium or ammonium salt thereof to form a copolymer solution.

In order to prepare the mats each having the specific volume ranges as defined in the present invention into the particular ratio relative to the total mats as defined in the present invention, it is necessary to control the mean volume of the mats and also to reduce the fluctuation in the volume.

In case of applying electrostatic coating wherein the atomized liquid for the mats is attached to the desired portion by atomizing the liquid for the mats through the steps of feeding the liquid continuously into the head (hereinafter referred to "bell") of a cup-shaped rotary atomizer and then charging the atomized liquid with electric charge, the size of the atomized liquid can be changed by determining appropriately the rotation of the bell, the shape of the bell and the feed of the liquid. Accordingly, the rotation of the bell, the shape of the bell and the feed of the liquid are controlled so as to form the mats including those having specific range of volumes defined in the present invention which are in a particular ratio as defined in the present invention.

The droplets (fine particles) of the liquid for the mats ever has a distribution of certain range in size. Thereby, a completely definite size of the fine particles cannot be formed. However, it is possible to form the fine particles having diameters of comparative narrow distribution under some condition by controlling the rotation of the bell, the shape of the bell and the feed of the liquid. Further, it is also possible to regulate the average diameter of the minute particles by bringing the above factors (the rotation of the bell, the shape of the bell and the feed of the liquid) under control.

Accordingly, selection of adequate conditions regarding the above factors makes it possible to set an average diameter of the fine particles to be formed close to a desired value and also to narrow the diameter distribution, which follows reducing a ratio of particles which are outside of the desired diameter range. The fine droplets of the liquid prepared by the above process generally attaches to the surface of the photosensitive layer included in the photosensitive lithographic printing plate and changes into the mats through the steps of drying and adhering thereto. Accordingly, it is possible to regulate the volumes of the mats to be formed by controlling the droplet sizes of the liquid properly.

BRIEF DESCRIPTION OF DRAWINGS

An exemplary process for preparing the photosensitive lithographic printing plate of the present invention will be explained below in reference to FIG. 1. FIG. 1 is a schematic view showing an apparatus for forming the mats on a photosensitive lithographic printing plate by using a rotary atomizer. A continuous web of substrate 1 having a photosensitive layer on one side thereof is running guided by rollers such as conveyer roller 8 and the like. To the photosensitive layer laminated on the substrate 1, a liquid 2 for forming mats atomized with a cup-shaped rotary atomizer through its rotary bell 7 is applied. The amount of the atomized liquid for forming mats is controlled in such manner as to be able to form mats (dried mats), including those each having particular volume as defined in the present invention which are in a specific ratio specified in the present invention, on the photosensitive layer. The head of the cup-shaped rotary atomizer is equipped with motor 6 and the rotary bell 7 which is driven by the motor and into which the liquid for forming mats is fed with a liquid-feed pump 5.

The substrate, to which the atomized liquid for forming mats has been applied and consequently fluid mats 3 are attached, changes its running direction with the aid of the conveyer roller 8 and is conveyed into the inside of a drying apparatus (chamber) 9. The liquid for forming mats coated on the substrate is dried in the drying apparatus and changed into mats 4 fixed on the substrate.

EXAMPLES

One side of an aluminum plate having a thickness of 0.24 mm was grained (dressed with sand grains) with a nylon brush using a water suspension of 400 mesh pumice stones and then washed well with water. This plate was immersed in an aqueous solution of sodium tertiary phosphate at 70° C. (5% by weight) for 2 minutes, rinsed with water and dried to prepare a substrate. Next, a liquid for forming a photosensitive layer was prepared by dissolving 1% by weight of polyhydroxyphenyl naphthoquinone-1,2-diazido-5-sulphonate, which can be obtained by condensation polymerization of acetone with pyrogallol as disclosed in JP-B-43-28403/1968 (the term"JP-B" as used herein means an "examined published Japanese patent application"), and 2% by weight of novolak phenol-formaldehyde into 20% by weight of methyl ethyl ketone, and then coated on the grained surface of the substrate followed by drying to make a photosensitive lithographic printing plate.

On the other hand, a liquid for forming mats was prepared by adjusting the solid content of a polymeric solution of methyl mathacrylate/ethyl acrylate/sodium acrylate (weight ratio=68:20:12 (charging ratio)) copolymer to 18% by weight.

Figure 1:
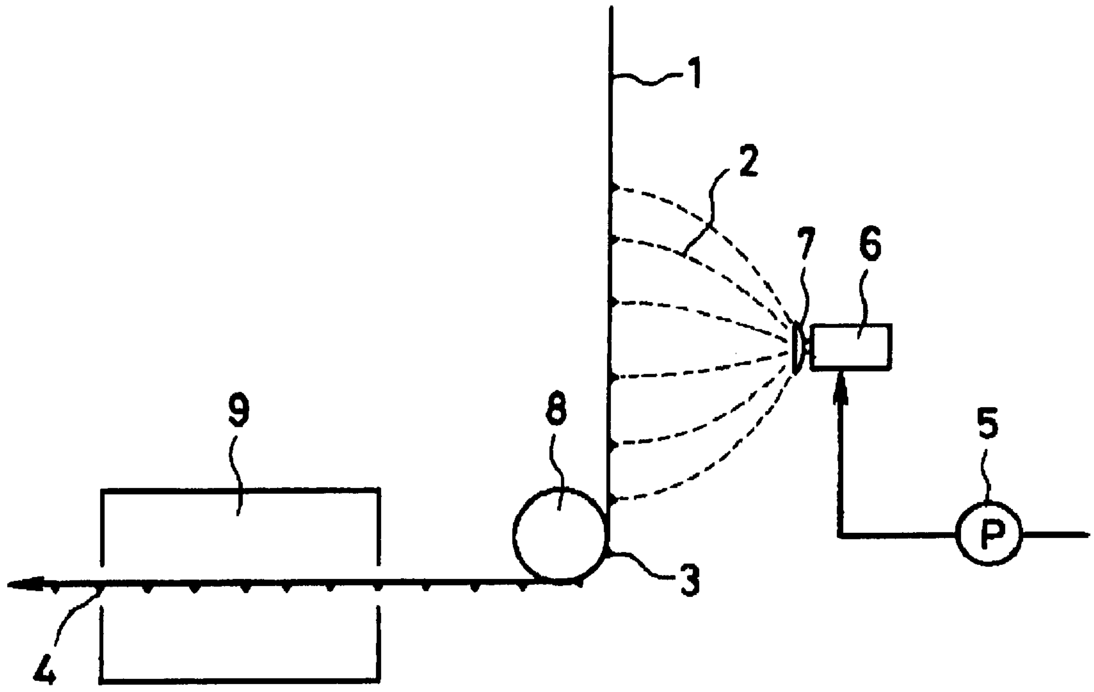
FIG. 1 is a schematic view showing an apparatus for forming mats on a photosensitive lithographic printing plate with a rotary atomizer.
Figure 2:
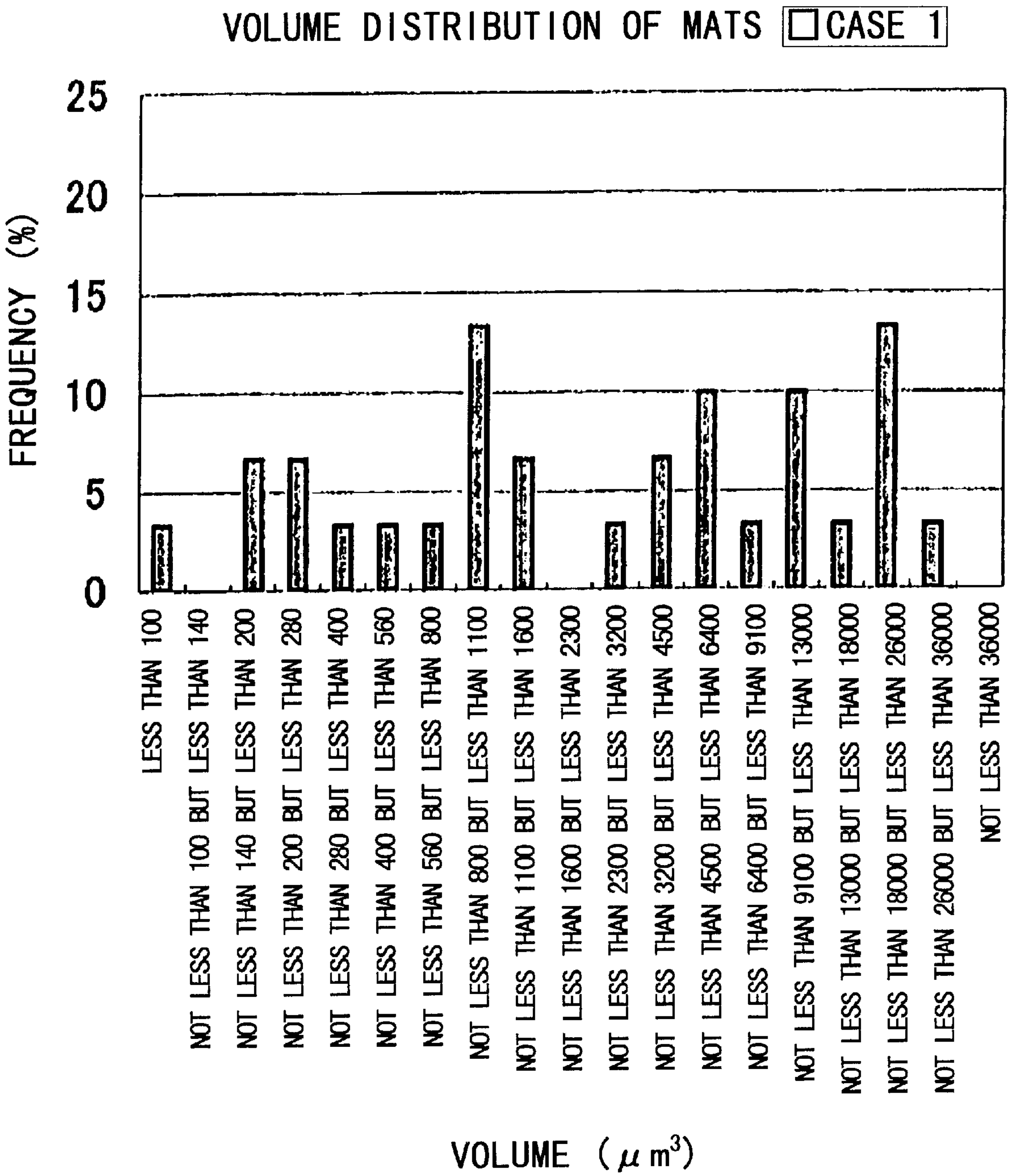
FIG. 2 is a graph showing volume distribution of mats attached on a sample (photographic lithographic printing plate) prepared in the exemplary case 1.
Figure 3:
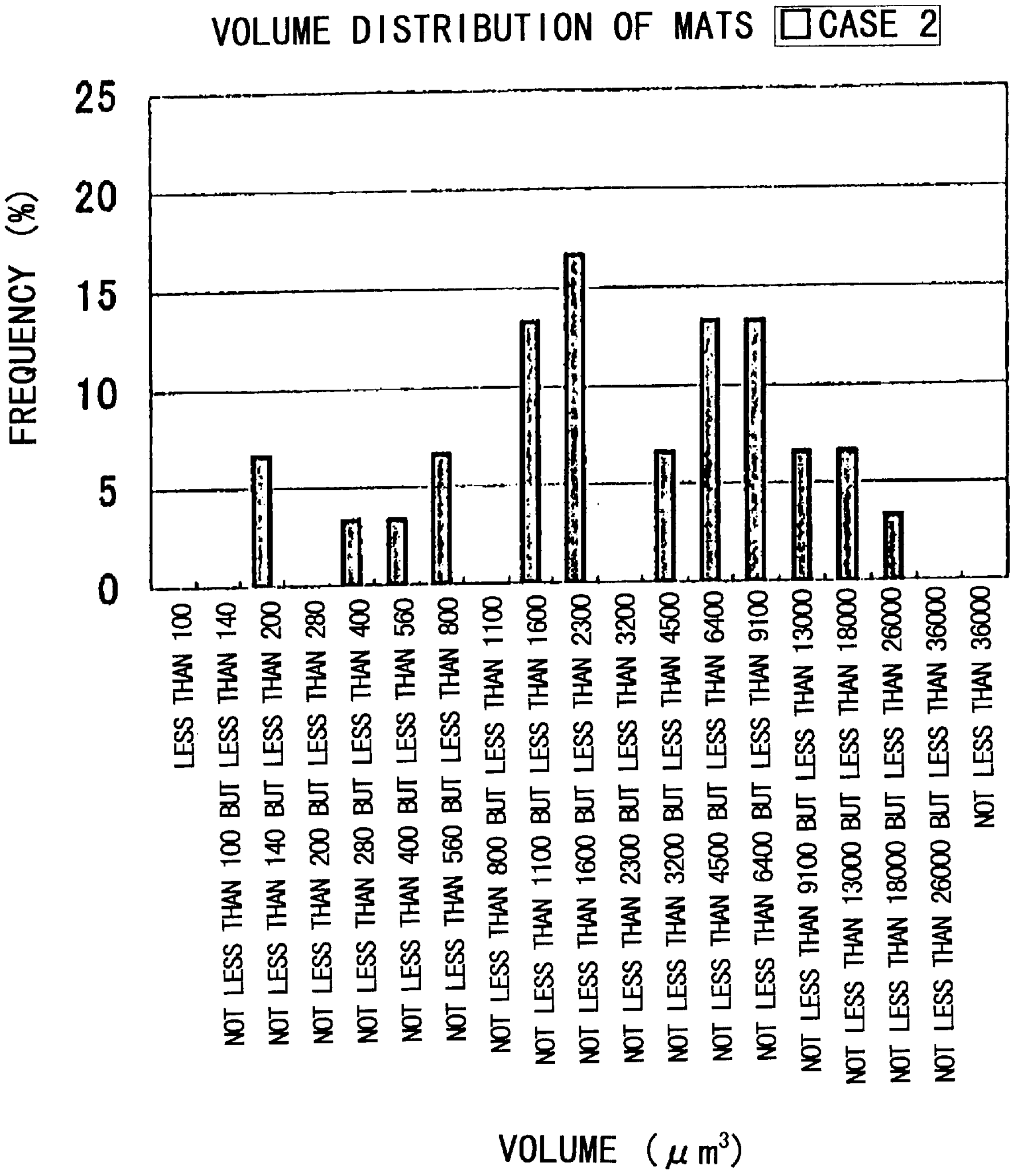
FIG. 3 is a graph showing volume distribution of mats attached on a sample (photographic lithographic printing plate) prepared in the exemplary case 2.
Figure 4:
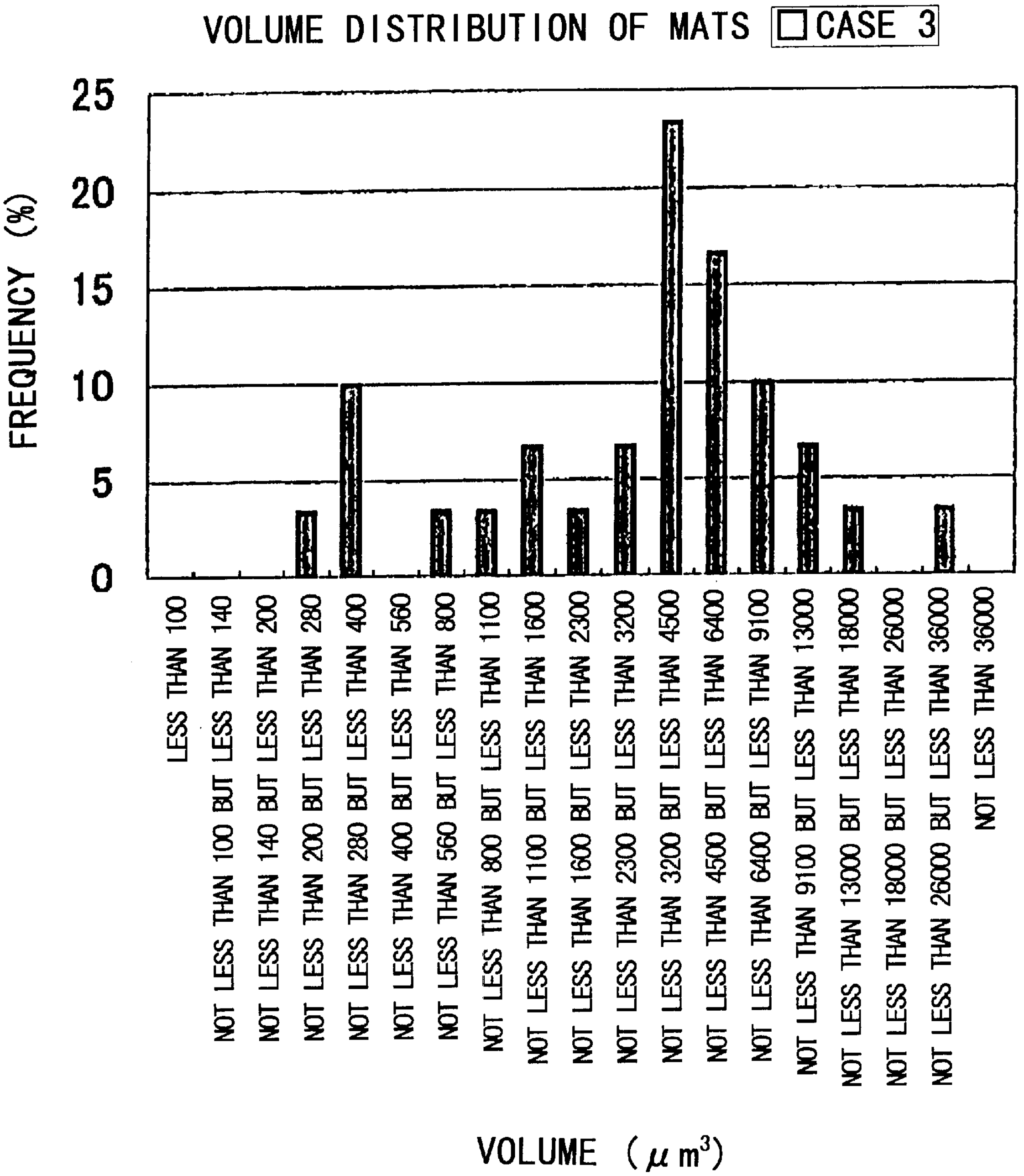
FIG. 4 is a graph showing volume distribution of mats attached on a sample (photographic lithographic printing plate) prepared in the exemplary case 3.
Figure 5:
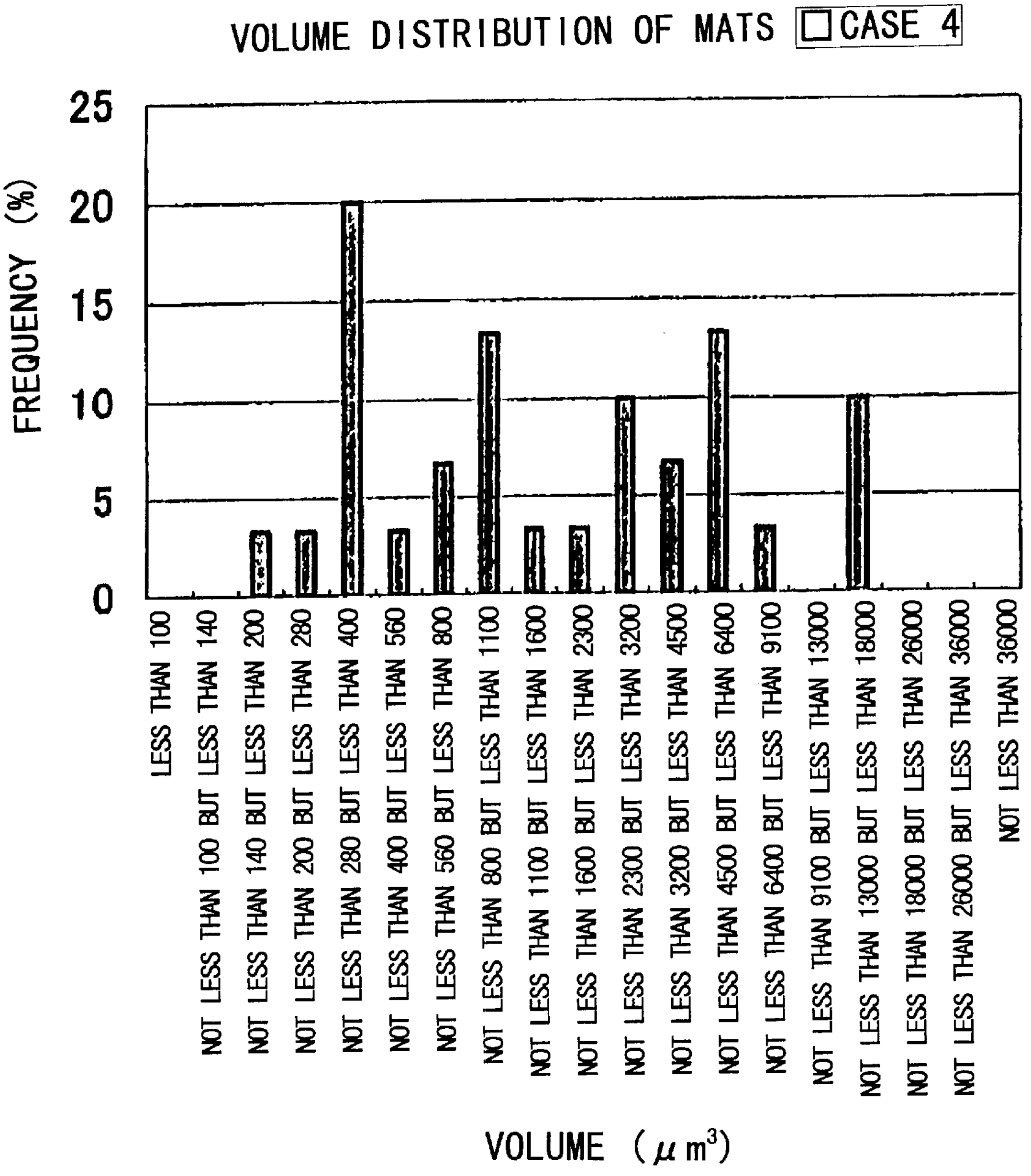
FIG. 5 is a graph showing volume distribution of mats attached on a sample (photographic lithographic printing plate) prepared in the exemplary case 4.
Figure 6:
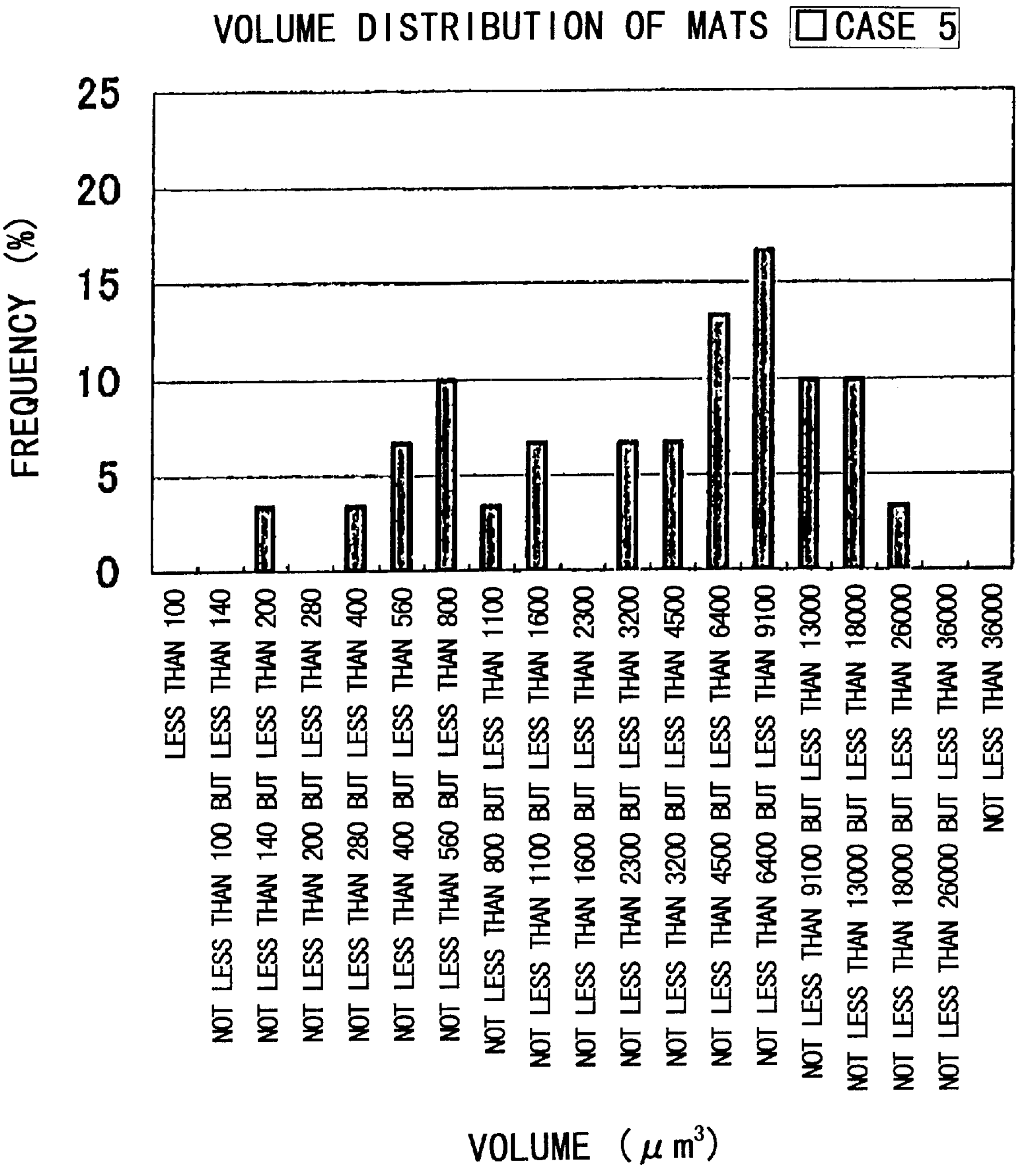
FIG. 6 is a graph showing volume distribution of mats attached on a sample (photographic lithographic printing plate) prepared in the exemplary case 5.
Figure 7:
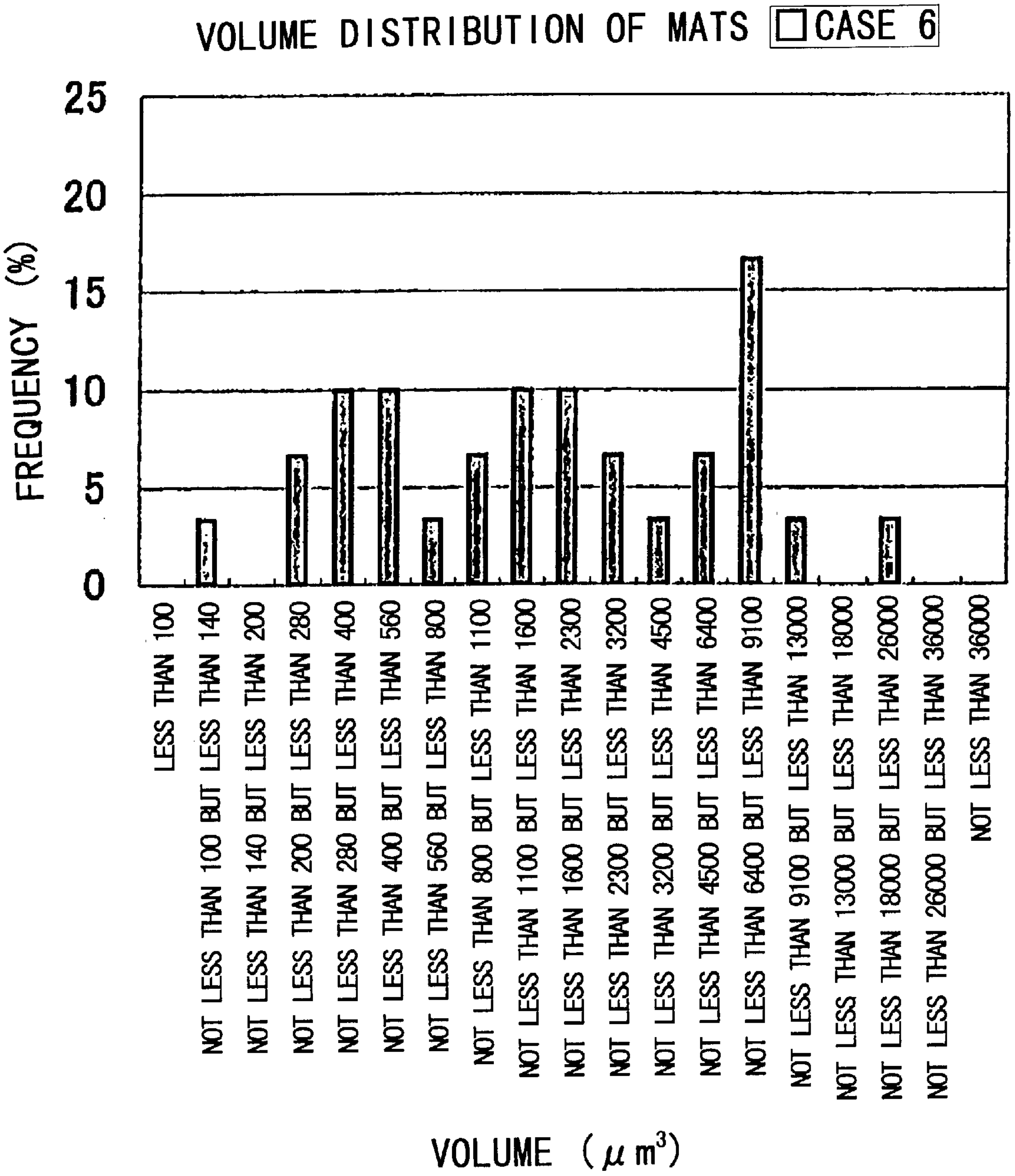
FIG. 7 is a graph showing volume distribution of mats attached on a sample (photographic lithographic printing plate) prepared in the exemplary case 6.
Figure 8:
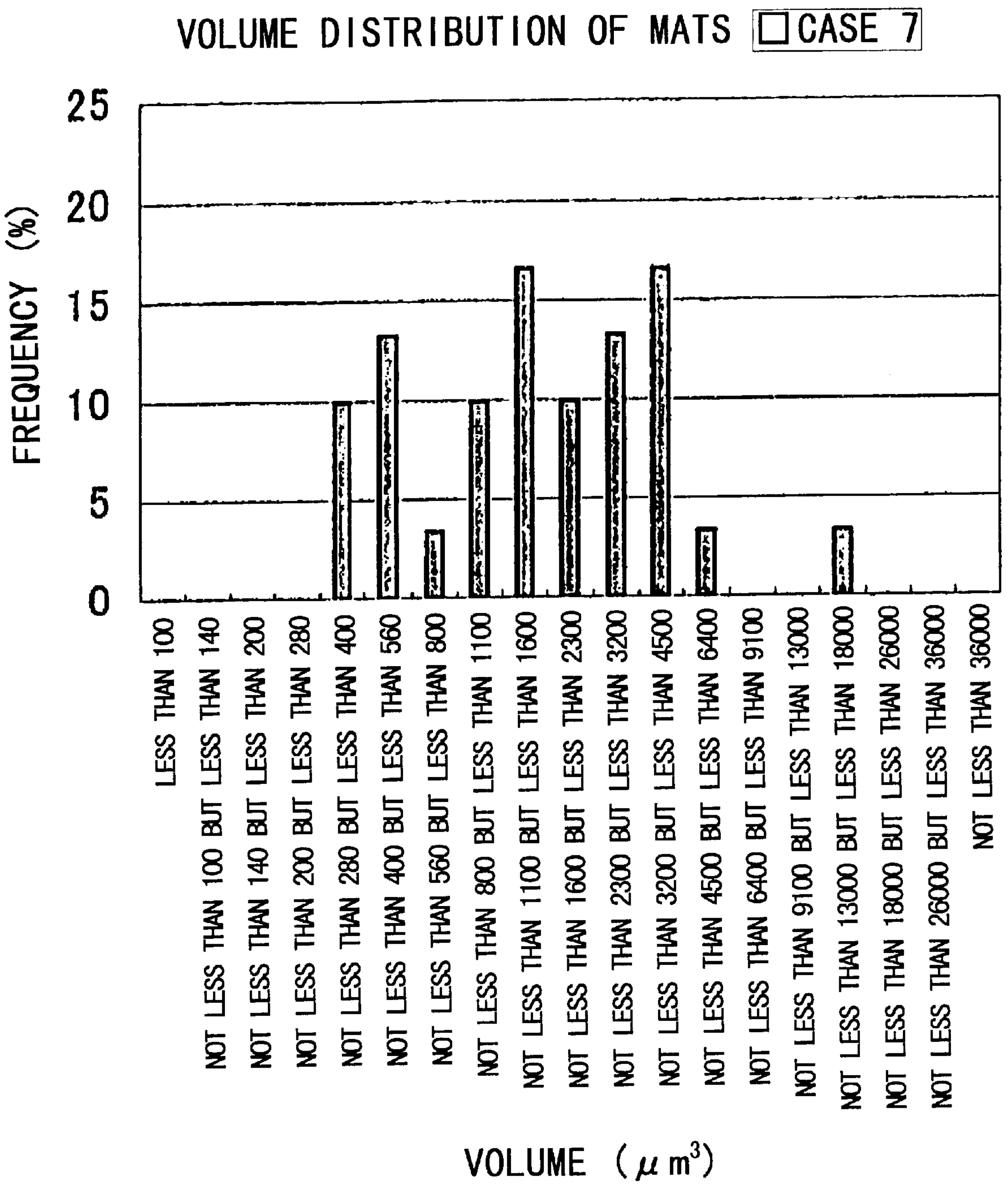
FIG. 8 is a graph showing volume distribution of mats attached on a sample (photographic lithographic printing plate) prepared in the exemplary case 7.
Figure 9:
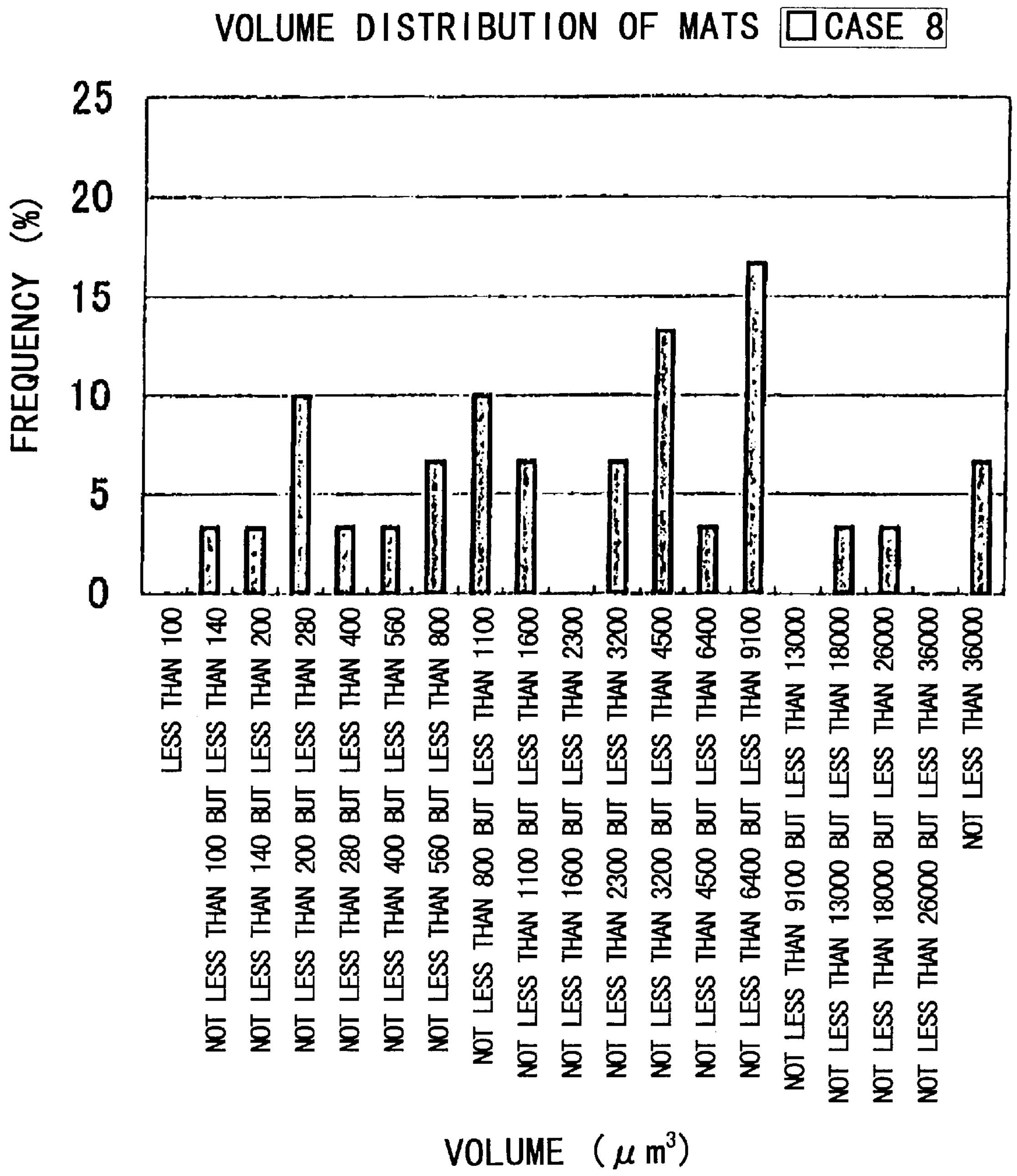
FIG. 9 is a graph showing volume distribution of mats attached on a sample (photographic lithographic printing plate) prepared in the exemplary case 8.
Figure 10:
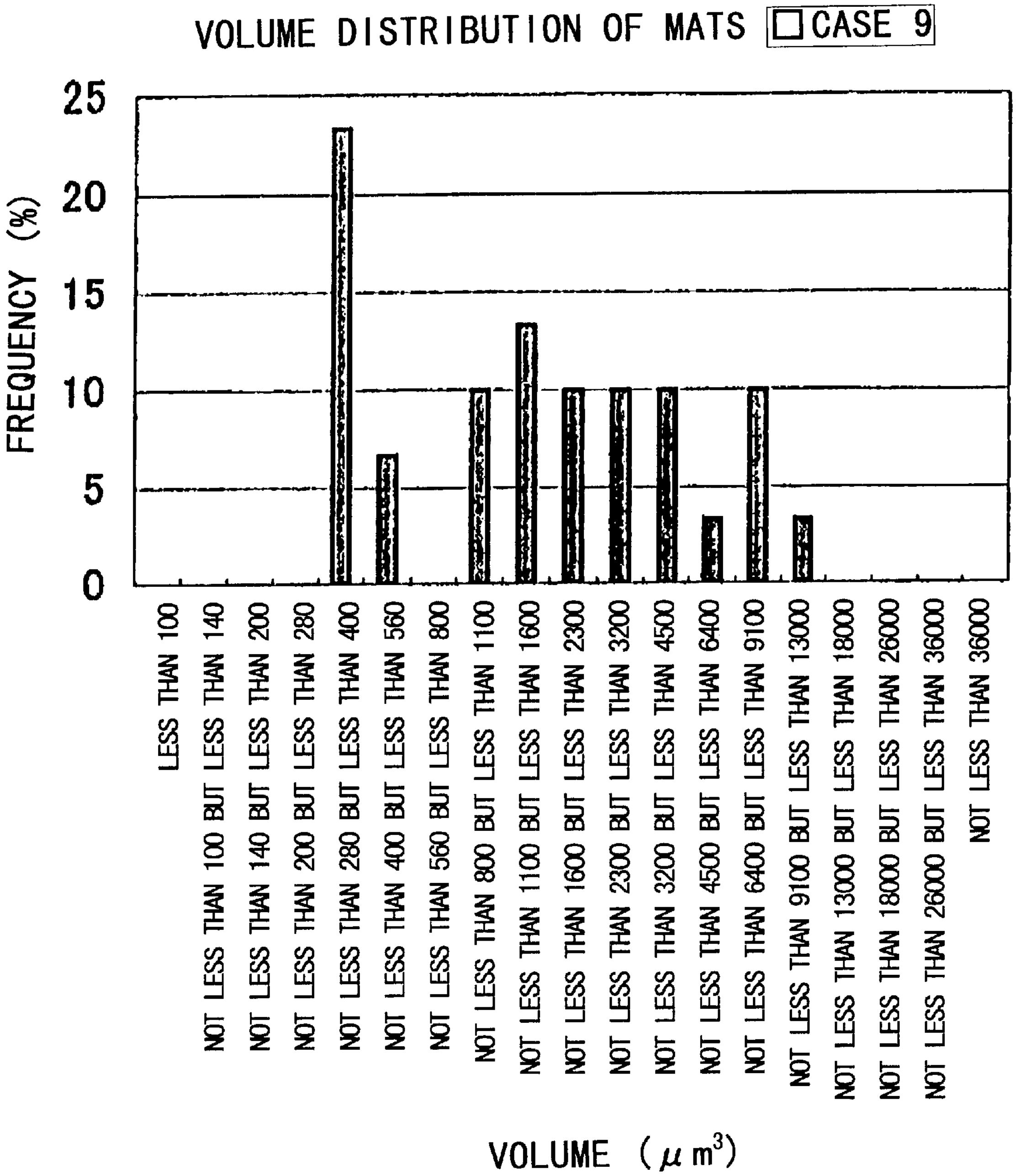
FIG. 10 is a graph showing volume distribution of mats attached on a sample (photographic lithographic printing plate) prepared in the exemplary case 9.
Figure 11:
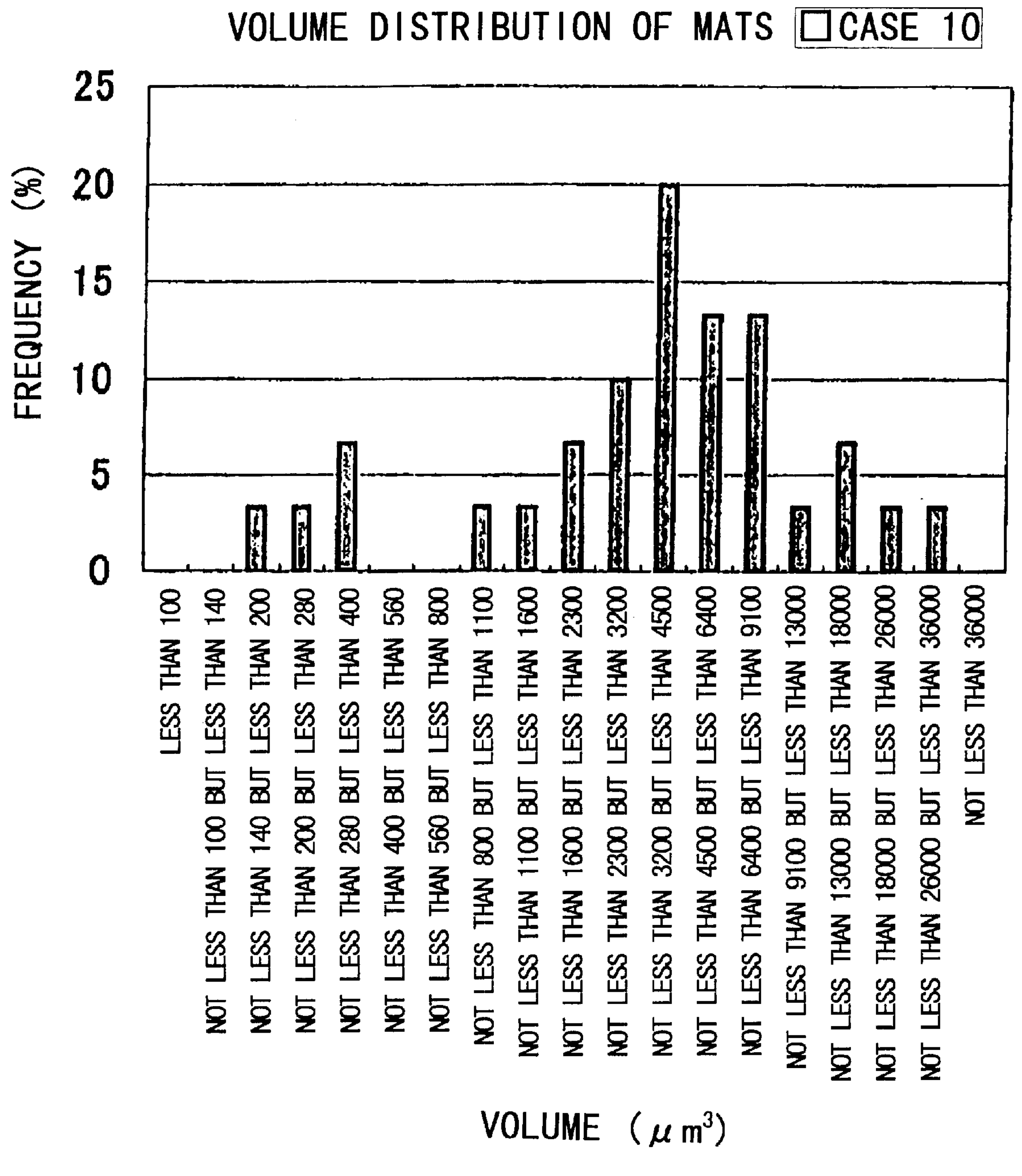
FIG. 11 is a graph showing volume distribution of mats attached on a sample (photographic lithographic printing plate) prepared in the exemplary case 10.
Figure 12:
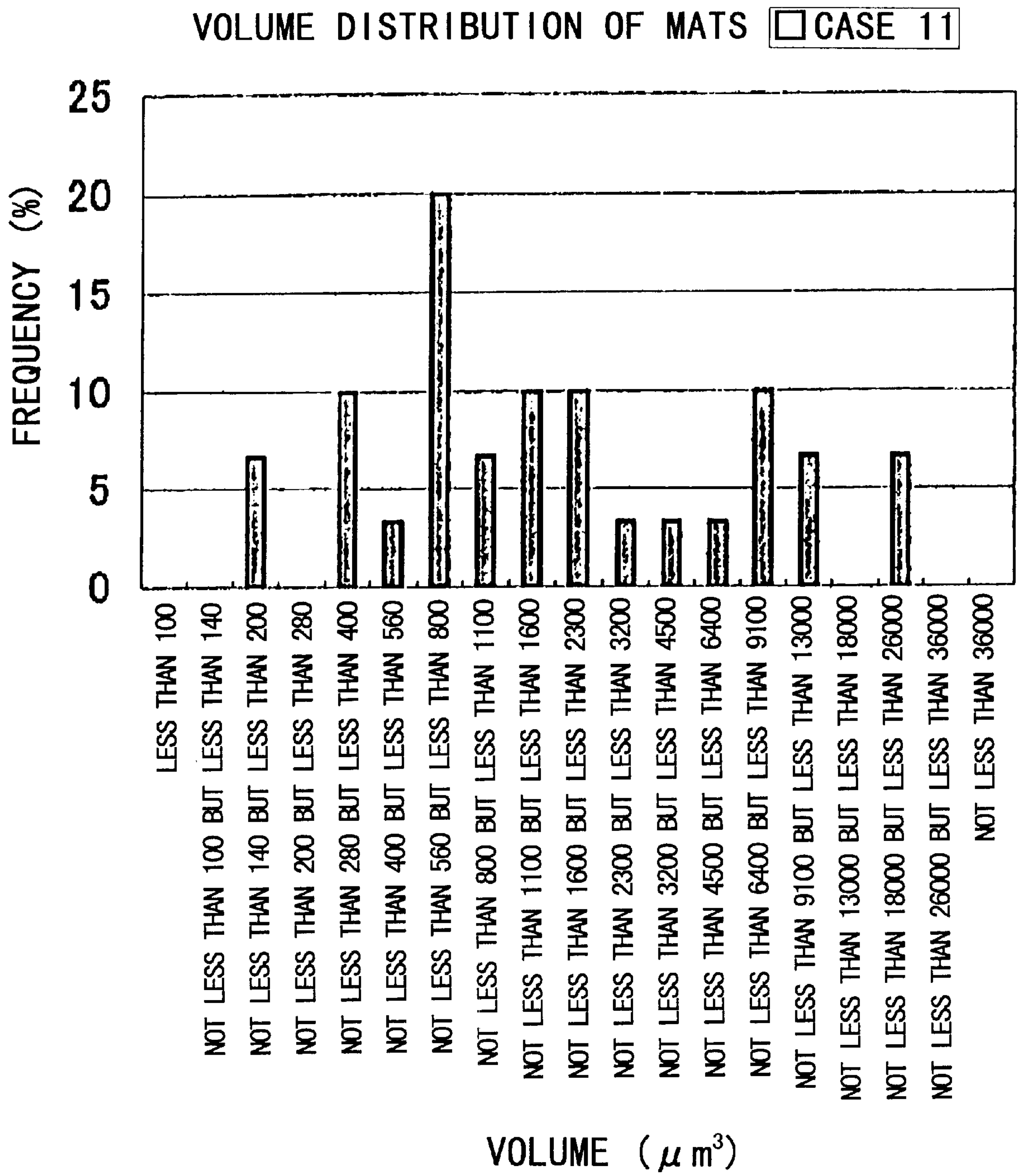
FIG. 12 is a graph showing volume distribution of mats attached on a sample (photographic lithographic printing plate) prepared in the exemplary case 11.
Figure 13:
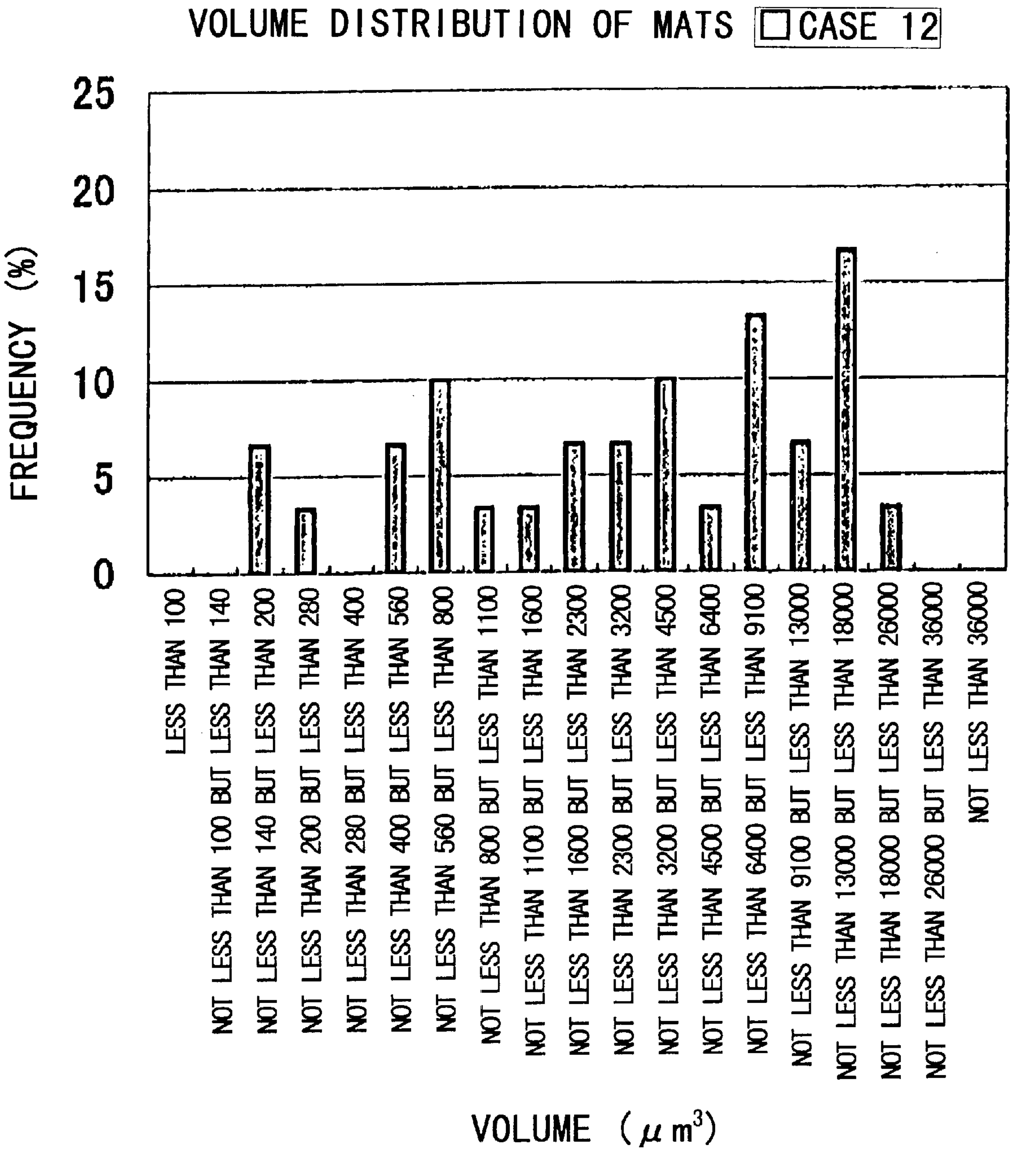
FIG. 13 is a graph showing volume distribution of mats attached on a sample (photographic lithographic printing plate) prepared in the exemplary case 12.

In applying the liquid for forming mats to the above substrate with the rotary atomizer, the rotation of the bell, the feed rate of the liquid and the shape of the bell were controlled as shown in FIG. 1 to make various types of photosensitive lithographic printing plates. In respect to the samples of these photosensitive lithographic printing plates, vacuum adhesion time with the film and the reproducibility of small dot images were measured after applying 7 kg/cm$^2$ of pressure which is expected to be applied in the courses from production till use, to the surface.

Each volume of the mats were determined as follows. Each three-dimensional shape of the mats was measured by using "Micromap 520" which is an instrument for measuring a three-dimensional surface-shape manufactured by Micromap Corp. The measured shape was divided into small members of matrices each having X, Y sides of 4 $\mu$m. The height values "Z" of every member of the matrices were integrated to calculate the volume.

The shapes of the bells A and B are different from each other in angle of a portion (the inner peripheral face of a bell) from which the liquid positioned at the apex of the bell seperates. The bells A and B are a cup-shaped bell having a slant of the following angle. In the bell A, the angle of the portion relative to the surface of revolution (plane which intersects the rotation axis of a bell at right angles) is about 88°; in the bell B, about 80°.

TABLE 1

| Case No. | Shape of Bell | Revolution of Bell (rpm) | Feed of Liquid (cc/m$^2$) | Mat ratio (%) 4,500 $\mu m^3$ or more less than 18,000 $\mu m^3$ | Mat ratio (%) 18,000 $\mu m^3$ or more | Number of Mats (/mm$^2$) | Vacuum adhesion time (sec) | Reproducibility of Small dots |
|---|---|---|---|---|---|---|---|---|
| 1 | A | 11,000 | 1.3 | 27 | 17 | 50 | 22 | X |
| 2 | A | 17,000 | 1.3 | 40 | 3 | 50 | 25 | ○ |
| 3 | A | 11,000 | 1 | 37 | 3 | 40 | 28 | ◎ |
| 4 | A | 17,000 | 1 | 27 | 0 | 30 | 32 | ◎ |
| 5 | A | 11,000 | 0.7 | 50 | 3 | 25 | 29 | ◎ |
| 6 | A | 17,000 | 0.7 | 27 | 3 | 20 | 38 | ◎ |
| 7 | B | 21,000 | 1.3 | 7 | 0 | 60 | 31 | ◎ |
| 8 | B | 14,000 | 1.3 | 24 | 10 | 55 | 24 | X |
| 9 | B | 21,000 | 1 | 17 | 0 | 40 | 32 | ◎ |
| 10 | B | 14,000 | 1 | 33 | 7 | 35 | 29 | ○ |
| 11 | B | 21,000 | 0.7 | 20 | 7 | 20 | 40 | ◎ |
| 12 | B | 14,000 | 0.7 | 40 | 3 | 25 | 35 | ◎ |

In the above table 1, each of the case nos. 1, 2, 3, 5, 8 and 10 shows that comparatively short vacuum adhesion time was attained and that there was little lowering in the function of the mats caused by the applied pressure. In these cases, the ratio was not less than 20% of the mats each having volume of not less than 4,500 $\mu m^3$ and less than 18,000 $\mu m^3$, and the total number of the attached mats was not less than 25/mm$^2$.

Further, the above Table 1 suggests that the reproducibility of small dot images in the case nos. 2, 3, 4, 5, 6, 7, 9, 10, 11 and 12 was in man acceptable range. In these cases, the ratio was less than 10% of the mats each having volume of 18,000 $\mu m^3$ or more. In the table 1, "O" found in the rows of "reproducibility of small dots" shows the evaluation "sufficiently excellent"; "○", "practical"; and "X" , "impractical" in respect to the reproducibility of small dots.

How to evaluate the reproducibility of small dots will be explained below more in detail. Using a gray-scale film for determining the photosensitivity, the reproducibility of the small dots was evaluated. The evaluation of "O" ranks in the state that the reproduced image of a small dot having a diameter of 10 $\mu$m can be observed; "○", in the state that the reproduced image of a small dot having a diameter of 12 $\mu$m can be observed; "△", in the state that the reproduced image of a small dot having a diameter of 15 $\mu$m can be observed; and "X", in the state that the reproduced image of a small dot having a diameter of 20 $\mu$m can be observed.

As a result of these evaluations, the requirements of vacuum adhesion time and small dot reproducibility were satisfied only in the case nos. 2, 3, 5.and 10 which correspond to the examples of the present invention. Studying the characteristics of these mats' shape with regard to the distribution number of the mats in the case nos. 1 to 12 shown in FIGS. 2 to 13 respectively, the mats each having volume of not less than 4,500 $\mu m^3$ and less than 18,000 $\mu m^3$ occupied not less than 20% of the total mats. In these cases where good results had been shown, the mats each having volume of not less than 18,000 $\mu m^3$ were less than 10%, and the number of the total mats was not less than 25/mm$^2$.

The photosensitive lithographic printing plate of the present invention includes mats formed thereon, and the number of the mats each having volume of not less than 4,500 $\mu m^3$ and less than 18,000 $\mu m^3$ exceeds 20% of the total mats. Accordingly, it is possible to secure good reproducibility of small dots of the small dot images, at the same time, endure pressure affecting usually in courses from production till use, and accordingly, maintain the function of the mats against the applied pressure.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A photosensitive lithographic printing plate comprising mats thereon, wherein a number of the mats, each volume of which is not less than 4,500 $\mu m^3$ and less than 18,000 $\mu m^3$, exceeds 20% relative to a total number of said mats.

2. The photosensitive lithographic printing plate as defined in claim 1, wherein the number of the mats, each volume of which is not less than 18,000 $\mu m^3$, is less than 10% relative to the total number of said mats.

3. The photosensitive lithographic printing plate as defined in claim 1, wherein said mats are distributed at a rate of 25/mm$^2$ or more.

4. The photosensitive lithographic printing plate as defined in claim 2, wherein said mats are distributed at a rate of 25/mm$^2$ or more.

5. The photosensitive lithographic printing plate as defined in claim 1, wherein said mats are formed through atomizing a liquid containing resin dissolved therein with a rotary atomizer.

* * * * *